ISO11102908B1

United States Patent
Komori et al.

(10) Patent No.: US 11,102,908 B1
(45) Date of Patent: Aug. 24, 2021

(54) STORAGE APPARATUS

(71) Applicant: Hitachi, Ltd., Tokyo (JP)

(72) Inventors: Shunsuke Komori, Tokyo (JP); Masanori Hori, Tokyo (JP); Toshihisa Tabuchi, Tokyo (JP); Naoki Wada, Tokyo (JP); Yosuke Ishida, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/200,511

(22) Filed: Mar. 12, 2021

(30) Foreign Application Priority Data

Jun. 16, 2020 (JP) .............................. JP2020-103796

(51) Int. Cl.
H05K 7/14 (2006.01)
G06F 1/26 (2006.01)
H05K 7/20 (2006.01)

(52) U.S. Cl.
CPC ........... *H05K 7/1492* (2013.01); *G06F 1/263* (2013.01); *H05K 7/20736* (2013.01)

(58) Field of Classification Search
CPC ............. H05K 7/1492; H05K 7/20736; H05K 7/20727
See application file for complete search history.

(56) References Cited

U.S. PATENT DOCUMENTS

| 8,868,957 B2* | 10/2014 | Davis ........................ G06F 1/30 713/340 |
| 10,372,177 B2* | 8/2019 | Kurosaki ........... H05K 7/20181 |
| 2010/0122838 A1 | 5/2010 | Asami et al. |
| 2020/0363844 A1* | 11/2020 | Sun ........................... G06F 1/18 |

FOREIGN PATENT DOCUMENTS

| JP | H05-160527 A | 6/1993 |
| JP | 2010-123708 A | 6/2010 |
| JP | 2012-209309 A | 10/2012 |

* cited by examiner

*Primary Examiner* — Mukundbhai G Patel
(74) *Attorney, Agent, or Firm* — Procopio, Cory, Hargreaves & Savitch LLP

(57) ABSTRACT

A storage apparatus mounted in a rack includes: a battery that is placed on a front surface side of a power supply and supplies power during a backup operation; a drive mounting unit that is placed in front of the battery and has drives mounted thereon; a midplane that is placed between the battery and the drive mounting unit and relays signals and power; and a sub-midplane that is placed between the midplane and the battery and relays signals and power from the power supply and the battery, wherein the midplane and the sub-midplane are coupled to each other by a bus bar for supplying the power from the power supply, and an air passage that is capable of supplying cooling air from an intake port, formed on the front surface, to the battery without allowing the cooling air to pass around a periphery of the drives is provided.

11 Claims, 9 Drawing Sheets

STORAGE APPARATUS

CROSS-REFERENCE TO PRIOR APPLICATION

This application relates to and claims the benefit of priority from Japanese Patent Application No. 2020-103796 filed on Jun. 16, 2020, the entire disclosure of which is incorporated herein by reference.

BACKGROUND

The present disclosure relates to a storage apparatus mounted in a rack, and more particularly relates to a cooling technique for the storage apparatus.

For example, there is a storage apparatus mounted in a rack and provided with a battery that supplies power during a backup operation in a case where power cannot be supplied by a power supply. In such a storage apparatus, the battery may be placed on, for example, a controller.

In recent years, the performance of drives equipped in storage apparatuses has been improved, hence further improvement in the performance of controllers is required.

As the controller performance improves, typically the amount of heat generated in the controller increases, leading to an increase in the temperature of the battery and to shortening of the service life of the battery. Therefore, changing the placement location of the battery and taking measures against heat in the storage apparatus become more necessary.

As the techniques relating to the measurements taken against heat, for example, the following techniques are known. For example, there is known a technique of releasing a heat from an IC by coupling a conduction unit for conducting heat on a rear surface of an IC package, to a heat dissipation part on a rear surface of a printed wiring board 31 through a plurality of through holes each having an inner peripheral wall to which a member having high thermal conductivity is plated (see, for example, Japanese Patent Application Publication No. H05-160527). Another technique is known in which heat resistance is reduced by installing a cooling structure onto a mount board by using a part of a wiring layer of an inner layer that is exposed to the outside of the mount board (see, for example, Japanese Patent Application Publication No. 2010-123708). There is also known a technique in which, by extending a large current inner layer pattern, which is formed in an inner layer of a printed circuit board and coupled to a heat generating component, to an outer edge of the printed circuit board, the heat generated from the heat generating component is transmitted to the outer edge of the printed circuit board through the large current inner layer pattern, thereby dissipating the heat (see, for example, Japanese Patent Application Publication No. 2012-209309).

SUMMARY

In a storage apparatus, heat is generated not only in a controller but also in, for example, drives, so simply changing the position of a battery is not necessarily enough. Furthermore, in a storage apparatus mounted on a rack, the size of the storage apparatus is limited, which limits the position of the battery as well. In addition, changing the position of the battery may affect the measures taken against heat in other components.

The present disclosure has been made in view of the foregoing circumstances, and an object thereof is to provide a technique capable of properly cooling a battery of a storage apparatus.

In order to achieve the foregoing object, a storage apparatus according to one aspect is a storage apparatus mounted in a rack, the storage apparatus includes a power supply that supplies power, a battery that is placed on an apparatus front surface side of the power supply and supplies power during a backup operation, a drive mounting unit that is placed further toward the apparatus front surface side than the battery and that mounts a plurality of drives for storing data, a controller that controls an entirety of the apparatus, a midplane that is placed between the battery and the drive mounting unit and relays signals and power among the power supply, the battery, the drive mounting unit, and the controller, and a sub-midplane that is placed between the midplane and the battery and relays signals and power from the power supply and the battery to the midplane, wherein the midplane and the sub-midplane are coupled to each other by a bus bar for supplying the power from the power supply to the midplane, and by one or more electric wires for transmitting signals and/or power other than the power of the power supply from the power supply and the battery, the storage apparatus further includes an air passage that is capable of supplying cooling air from an intake port, formed on the apparatus front surface, to the battery without allowing the cooling air to pass around a periphery of the drives.

According to the present disclosure, the battery of the storage apparatus can be cooled properly. Further objects, configurations, and effects of the present disclosure will become apparent from the following description of the embodiments.

DETAILED DESCRIPTION OF THE EMBODIMENT

An embodiment of the present disclosure is now described with reference to the drawings. It should be noted that the embodiments described hereinafter do not limit the present invention according to the claims, and all of the elements and combinations thereof described in the embodiments are not necessarily essential for the means for solution of the present invention.

Figure 1:
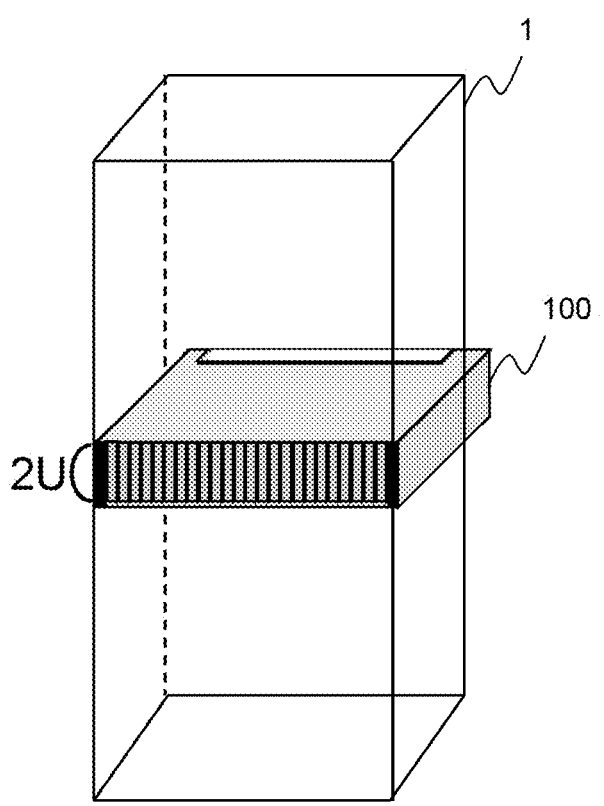
FIG. 1 is an overall configuration diagram of a rack system according to an embodiment.

FIG. 1 is an overall configuration diagram of a rack system according to an embodiment.

A rack system 1 has a width of, for example, 19 inches, and can mount one or more storage apparatuses 100, one or more server apparatuses, and the like side by side in the vertical direction. A plurality of rack systems 1 are arranged side by side in a horizontal direction in a data center. The storage apparatus 100 has a height of, for example, 2 U (3.5 inches).

Figure 2:
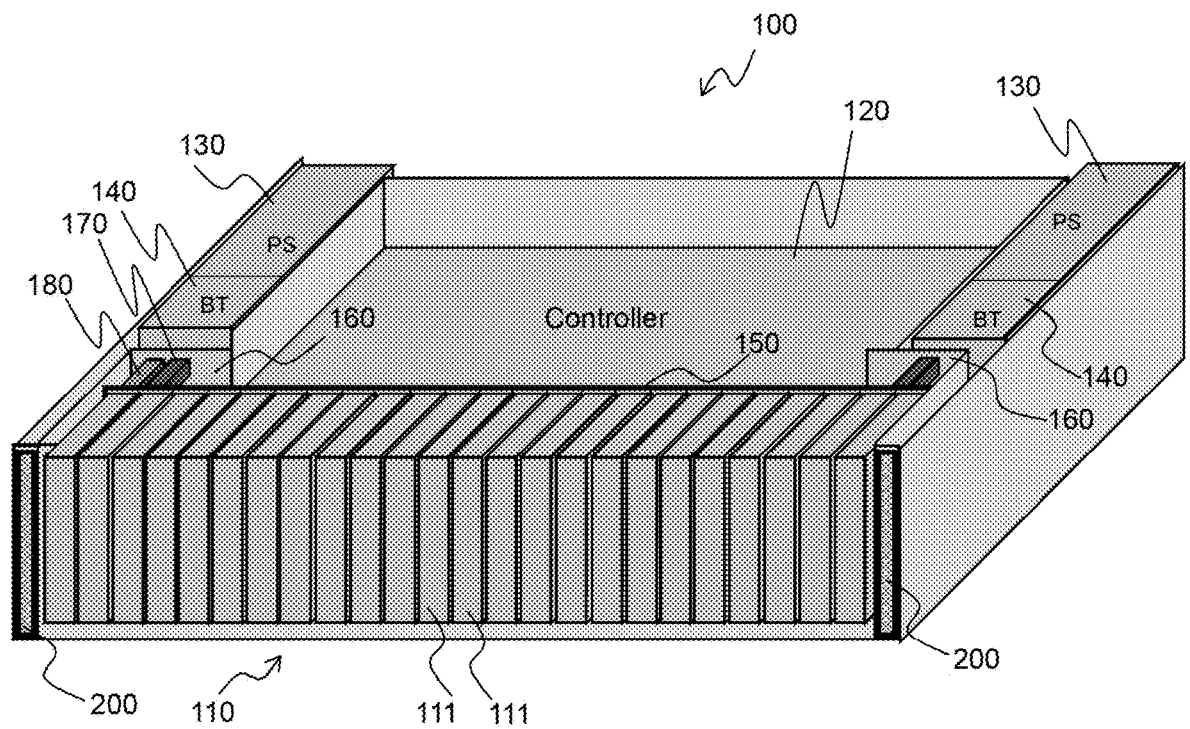
FIG. 2 is a perspective view of a storage apparatus according to the embodiment.
Figure 3:
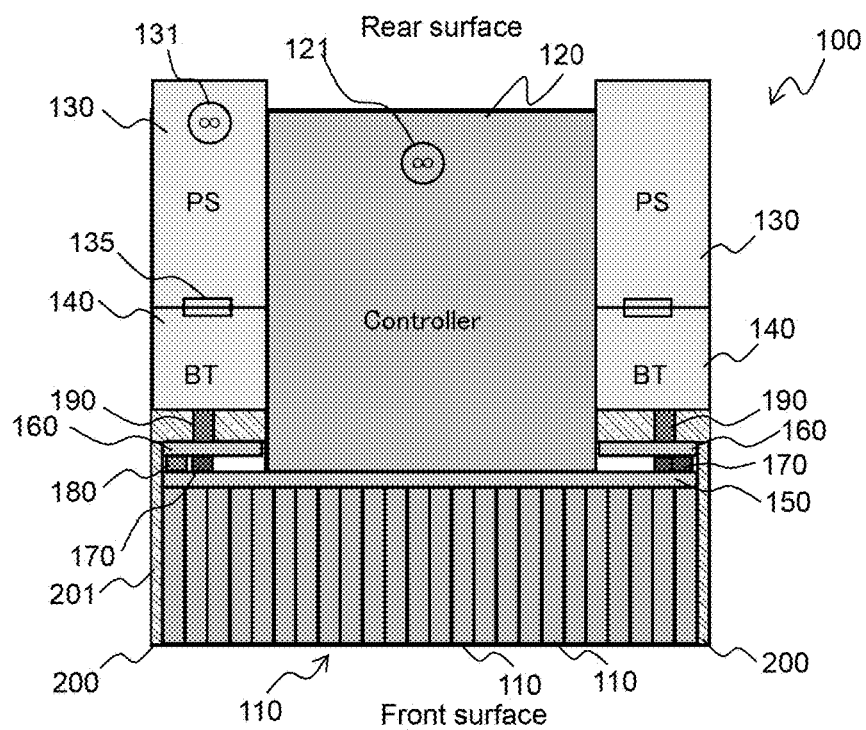
FIG. 3 is an upper view of the storage apparatus according to the embodiment.

FIG. 2 is a perspective view of the storage apparatus according to the embodiment. FIG. 3 is an upper view of the storage apparatus according to the embodiment. Note that FIGS. 2 and 3 omit the illustration of a sheet metal on an upper surface of the storage apparatus 100.

The storage apparatus 100 includes a drive mounting unit 110, a controller 120, a power supply (PS) 130, a battery (BT) 140, a midplane 150, and a sub-midplane 160. In the present embodiment, the storage apparatus 100 includes two systems of the controller 120, the power supply 130, the battery 140, and the sub-midplane 160, for the purpose of redundancy. Note that the midplane 150 is often called "backboard".

The drive mounting unit 110 is placed on the front surface side of the storage apparatus 100 (also simply referred to as "apparatus"). The drive mounting unit 110 can mount a plurality of drives 111. The drive 111 is, for example, a storage device for storing data, such as an HDD (Hard Disk Drive) or an SSD (Solid State Drive). The drive 111 may be, for example, an SSD connected by an NVMe (Non-Volatile Memory Express).

The controller 120 is arranged on the rear surface side of the storage apparatus 100. The controller 120 controls the entire storage apparatus 100 in an integrated manner. For example, the controller 120 has a processor, a memory, a network interface (I/F), a drive interface (I/F), and the like, and controls I/O processing (input/output processing) for the drives 111 from the outside via a network. In the present embodiment, the two controllers 120 are arranged so as to be stacked one above the other.

The power supply (PS) 130 is arranged adjacent to the controller 120 placed on the rear surface side of the storage apparatus 100. In the present embodiment, the two power supplies 130 are arranged at both ends with the controllers 120 therebetween. The power supply 130 supplies power for operating each unit of the storage apparatus 100. In the present embodiment, the power supply 130 receives the power supplied from a commercial power source, converts said power into the power for the storage apparatus 100, and supplies the power. The power supply 130 has a fan 131 that allows air to flow from the front surface to the rear surface side. The power supply 130 has a vent (not shown) through which the air can flow to a surface on the front surface side and a surface on the rear surface side.

The battery (BT) 140 is arranged on the front surface side of the power supply 130. The battery 140 supplies backup power in a case where the supply of power by the power supply 130 is stopped. The battery 140 has a vent (not shown) through which the air can flow to the surface on the front surface side and the surface on the rear surface side. Power lines and signal lines from the power supply 130 are coupled to the battery 140 via connector 135. The battery 140 is coupled to battery connector 190 in which the signal lines and the power lines of the power supply 130 and signal lines and power lines of the battery 140 are bundled. Note that the signal lines that can be shared by the power supply 130 and the battery 140 may be integrated. In this manner, the size of battery connector 190 can be reduced.

The midplane 150 is placed between the drive mounting unit 110 and the controller 120 in such a manner that a longitudinal direction of the midplane 150 extends in the horizontal direction of the storage apparatus 100. In the present embodiment, the controller 120, the power supply 130, the battery 140, and the sub-midplane 160 are located behind the midplane 150. The midplane 150 mediates signals and power among the drive mounting unit 110, the controller 120, the power supply 130, and the battery 140.

The sub-midplane 160 is arranged between the midplane 150 and the battery 140. The sub-midplane 160 mediates signals and power between the midplane 150 and the battery 140, and the power supply 130. Moreover, the sub-midplane 160 and the battery 140 are coupled via the battery connector 190. The sub-midplane 160 and the midplane 150 are coupled via a pair of bus bars 170 and a connector 180.

The pair of bus bars 170 are bus bars for supplying the power from the power supply 130; a voltage from a power supply 130 is applied to one of the bus bars 170 via the sub-midplane 160, and the other bus bar 170 is coupled to the ground via the sub-midplane 160.

The connector 180 couples electric wires other than the power lines from the power supply 130 among the electric wires of the battery connector 190, that is, the signal lines of the power supply 130 and the signal lines and power lines of the battery 140, to the midplane 150.

Therefore, in the sub-midplane 160, a circuit that electrically couples the plurality of power lines of the power supply 130 in the battery connector 190 and the bus bar 170, and a circuit for coupling the other signal lines and power lines of the battery connector 190 to the connector 180 are configured.

Intake ports 200 are provided at respective left and right ends of the drive mounting unit 110 on the front surface of the storage apparatus 100. BT/PS cooling passage 201 (air passages) for allowing air for cooling the battery 140 and the power supply 130 to flow without letting the air pass through the inside of the drive mounting unit 110, is formed behind the intake port 200. Another rack system may be placed on each of the left and right sides of the rack system 1 on which the storage apparatus 100 is mounted. However, even in such a case where other rack systems are arranged, the intake ports 200 are not closed, so the cooling air can be sucked in without any trouble.

The sub-midplane 160 is described next in detail.

Figure 4A:
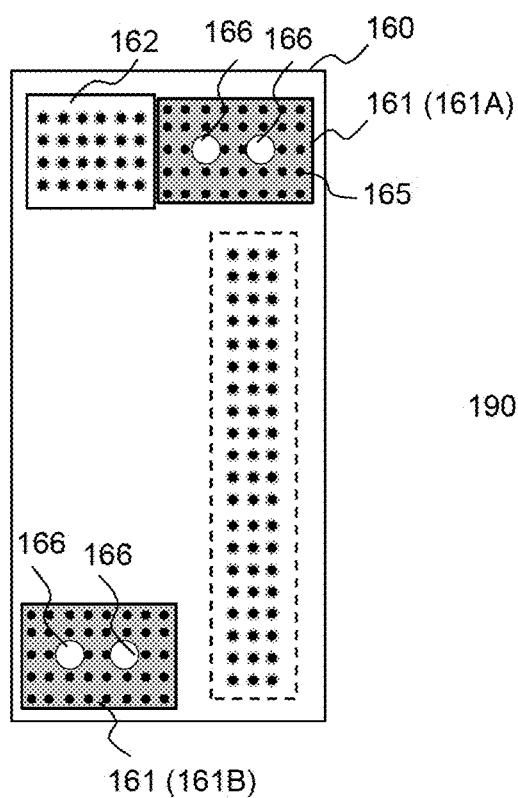
FIGS. 4(A) and 4(B) are configuration diagrams of a sub-midplane according to the embodiment.
Figure 4B:
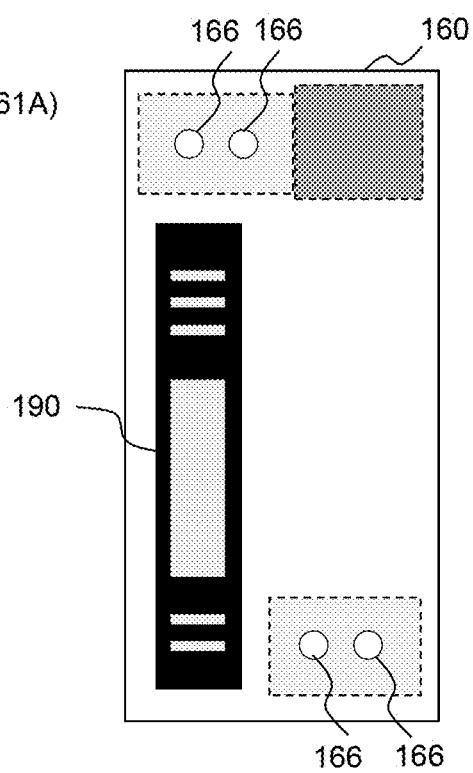

FIG. 4 is a configuration diagram of a sub-midplane according to the embodiment. FIG. 4(A) is a diagram showing the front surface side of the sub-midplane 160 on the left side (also simply referred to as the left side, hereinafter) when the storage apparatus 100 is viewed from the front, and FIG. 4(B) is a diagram showing the rear surface side of this left sub-midplane 160.

As shown in FIG. 4(A), bus bar attachment areas 161 (161A, 161B) to which the bus bars 170 are attached, and a connector attachment area 162 to which the connector 180 is attached, are formed on the front surface side of the sub-midplane 160, that is, on the surface facing the midplane 150. In the present embodiment, the bus bar attachment area 161A is an area to which the bus bar 170 to be having a high potential is attached, and the bus bar attachment area 161B is an area to which the bus bar 170 coupled to the ground is attached. The bus bar attachment area 161A is placed to the right of the connector attachment area 162, that is, on the side far from a left end of the storage apparatus 100.

Screw holes 166 for fixing the bus bar 170 to the sub-midplane 160 are formed in the bus bar attachment area 161. Furthermore, a plurality of vias 165 are arranged in the bus bar attachment area 161. The via 165 has a film of a conductor (such as copper) formed on an inner circumference thereof, and electrically couples a plurality of layers of the sub-midplane 160 together.

The connector 180 is coupled to the connector attachment area 162 by means of, for example, press-fitting.

On the other hand, as shown in FIG. 4(B), the battery connector 190 for coupling the sub-midplane 160 to the battery 140 is coupled on the rear surface side of the sub-midplane 160, that is, the surface facing the battery 140. Also, on the rear surface side of the sub-midplane 160, screw holes 166 for attaching the bus bars 170 are formed. The bus bar 170 is attached to the front surface side of the sub-midplane 160 by screwing in screws from the rear surface side.

Note that the front and rear surfaces of the sub-midplane 160 on the right side are illustrated by rotating the front and rear surfaces of the sub-midplane 160 shown in FIG. 4 by 180 degrees, respectively.

The midplane 150 is described next in detail.

Figure 5A:
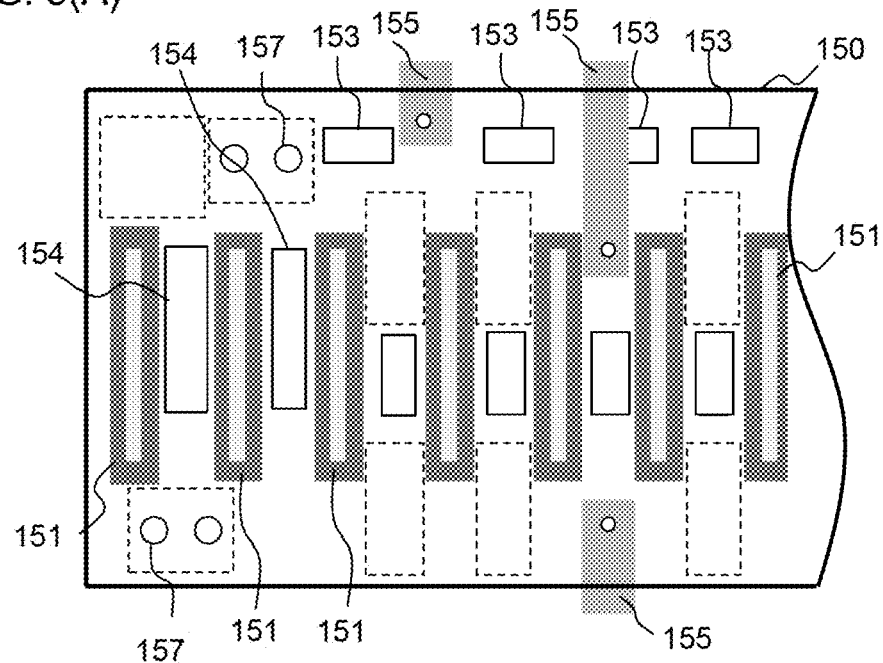
FIGS. 5(A) and 5(B) are configuration diagrams of a midplane according to the embodiment.
Figure 5B:
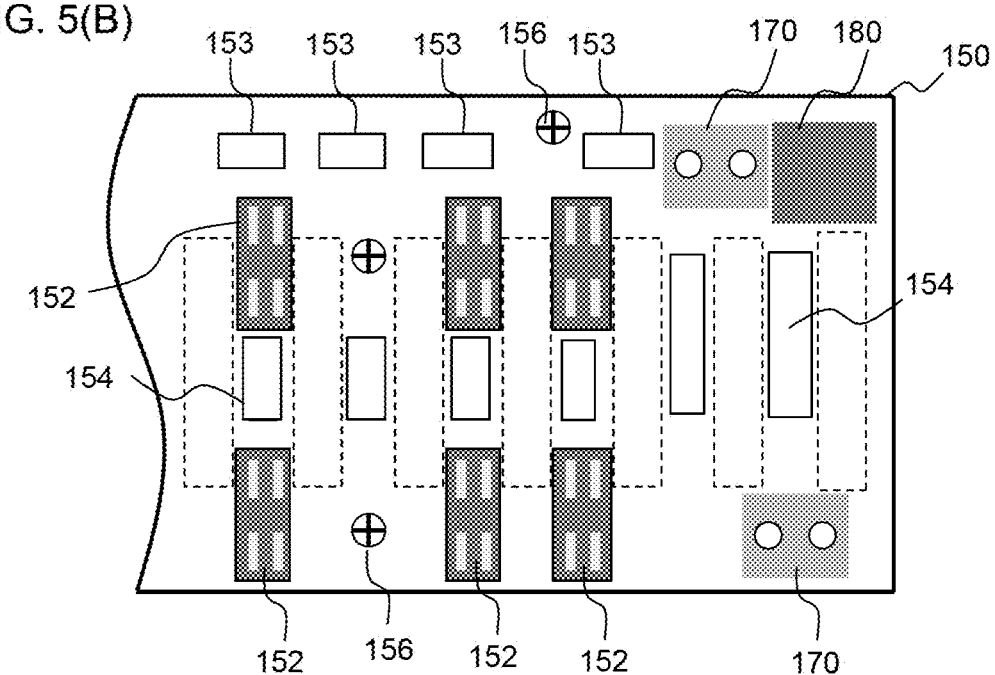

FIG. 5 is a configuration diagram of the midplane according to the embodiment. FIG. 5(A) is a front view of a left part of a front surface of the midplane 150 of the storage apparatus 100, and FIG. 5(B) is a rear view of a left part of the front surface of the midplane 150.

As shown in FIG. 5(A), a plurality of drive connectors 151 to which the drives 111 are coupled are arranged horizontally on the front surface of the midplane 150, that is, the surface of the drive mounting unit 110 side. Vertically long vent 154 are provided between the drive connectors 151. Also, a plurality of horizontally long vents 153 are provided in the horizontal direction of the attachment area of the bus bar 170 in an upper part of the midplane 150. In addition, screw holes 157 for attaching the bus bar 170 are formed at positions corresponding to the positions on the midplane 150 where the bus bar 170 is attached. Furthermore, coupling units 155 leading to a sheet metal (not shown) on an upper surface or a lower surface of the drive mounting unit 110 is coupled to the midplane 150.

On the other hand, as shown in FIG. 5(B), the bus bars 170 and the connector 180 that are coupled to the sub-midplane 160 are coupled on the rear surface side of the midplane 150, that is, the surface facing the sub-midplane 160. The midplane 150 is also provided with a plurality of controller connectors 152 coupled to the controllers 120. The controller connectors 152 are arranged above and below the vents 154. The upper controller connectors 152 among the plurality of controller connectors 152 are coupled to the upper controller 120, and the lower controller connectors 152 are coupled to the lower controller 120. Also, screws 156 for fixing the coupling units 155 are screwed into the midplane 150.

Note that a right part of the front surface of the midplane 150 has the same configuration as the left section of the same, except that the positions of the bus bars 170 and the connector 180 correspond to the positions corresponding to the sub-midplane 160 on the right side.

An outline of the features of the storage apparatus 100 are described next.

Figure 6:
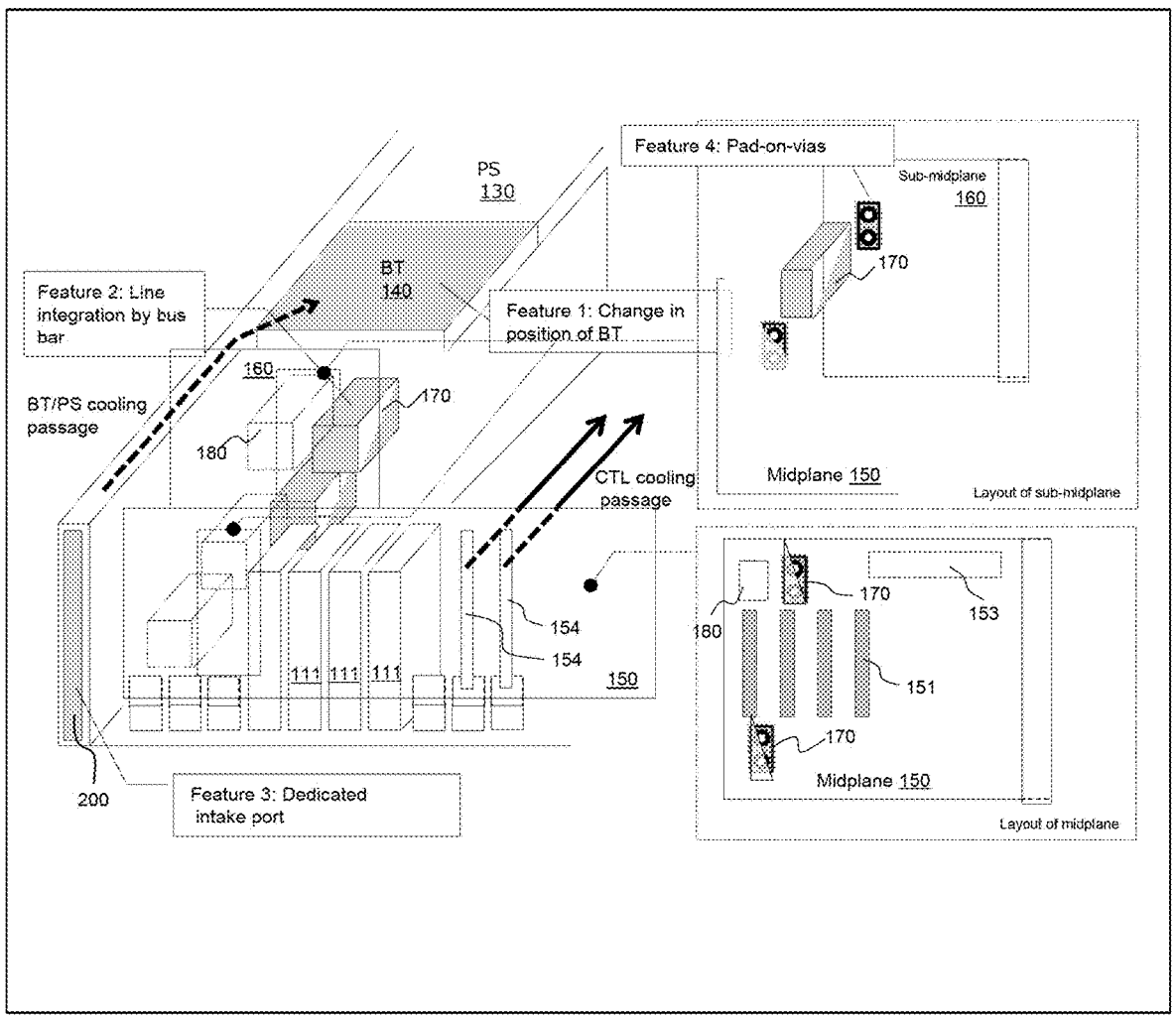
FIG. 6 is a diagram for explaining an outline of the features of the storage apparatus according to the embodiment.

FIG. 6 is a diagram for explaining an outline of the features of the storage apparatus according to the embodiment.

The features of the storage apparatus 100 are, for example, that the battery 140 is arranged on the front surface side of the power supply 130 (feature 1: change in the position of the battery), that the plurality of power lines of the power supply 130 are integrated into the bus bar 170 (feature 2: line integration by the bus bar), that the intake port 200 dedicated to the BT/PS cooling passage 201 for cooling the battery 140 is provided at front ends of the apparatus (feature 3: dedicated intake port), and that the bus bar 170 is coupled to the sub-midplane 160 and the midplane 150 at the vias 165 (feature 4: pad-on-vias). These features are described hereinafter in detail.

First of all, feature 1, "change in the position of the battery", is described.

Figure 7A:
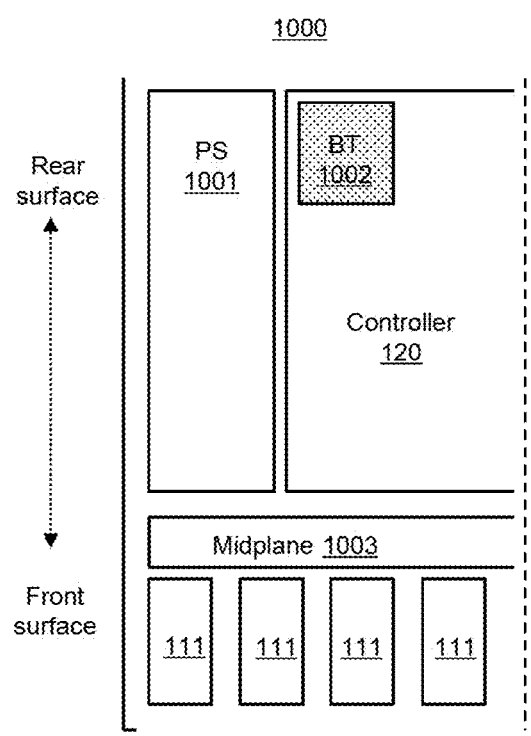
FIGS. 7(A) and 7(B) are diagrams for explaining the position change in the position of a battery to the embodiment.
Figure 7B:
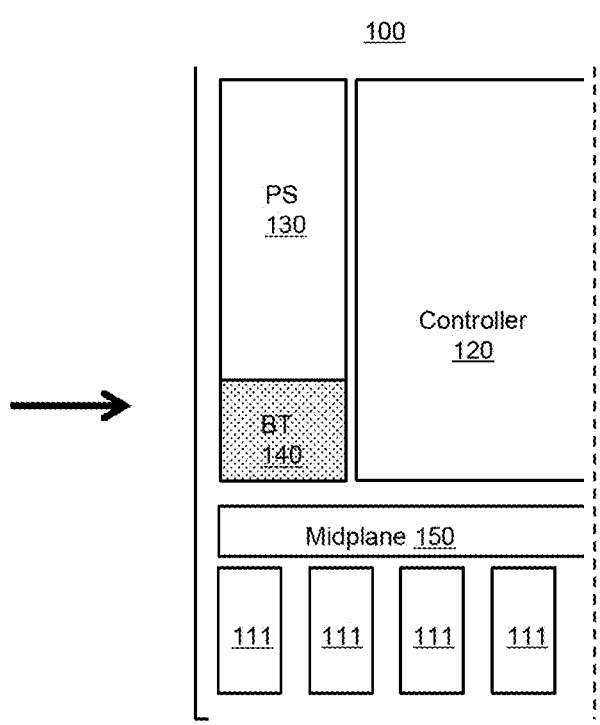

FIG. 7 is a diagram for explaining change in the position of the battery according to the embodiment. FIG. 7(A) shows a configuration of a storage apparatus 1000 according to a comparative example, and FIG. 7(B) shows a configuration of the storage apparatus 100 according to the embodiment.

In the storage apparatus 1000 according to the comparative example, a battery 1002 is placed at an upper portion of the controller 120, as shown in FIG. 7(A). Therefore, the temperature of the battery 1002 increases due to the impact of the heat of the controller 120 and the drives 111, resulting in shortening of the life of the battery.

In the storage apparatus 100 according to the embodiment, on the other hand, since the battery 140 is arranged on the front surface side of the power supply 130, the impact of heat of the controller 120 is small, appropriately preventing the life of the battery 140 from being shortened.

Integration of wiring lines by means of the bus bar is described next.

FIG. 8 is a diagram for explaining integration of the wiring lines by means of the bus bar according to the embodiment. FIG. 8(A) shows the configuration of the storage apparatus 1000 according to the comparative example, FIG. 8(B) shows a configuration of a storage apparatus according to another comparative example, FIG. 8(C) shows the configuration of the storage apparatus 100 according to the present embodiment, and FIG. 8(D) shows a diagram for explaining the midplane 150 of the storage apparatus 100 according to the present embodiment.

Figure 8A:
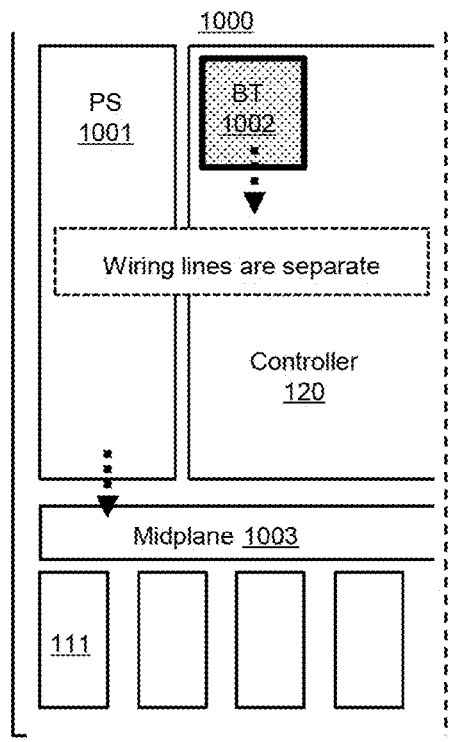
FIGS. 8(A), 8(B), 8(C), and 8(D) are diagrams for explaining the integration of wiring lines by means of a bus bar according to the embodiment.

In the storage apparatus 1000 according to the comparative example, the battery 1002 is placed at the upper portion of the controller 120, as shown in FIG. 8(A). Thus, the wiring lines between the battery 1002 and a midplane 1003 exist separately from the wiring lines between a power supply 1001 and the midplane 1003.

On the other hand, in view of the fact that the battery is arranged in front of the power supply, in the storage apparatus, for example, the battery and the power supply are arranged in series with respect to the midplane 1003; it is conceivable that the wiring lines of the battery and the power supply can be integrated and coupled to the midplane. Therefore, it is necessary to couple the connector in which the wiring lines of the power supply and the battery are integrated needs to be coupled in the vicinity of the wiring lines of the power supply in the midplane 1003 of the storage apparatus 1000. Specifically, a relatively large area is required in the midplane 1003.

Figure 8B:
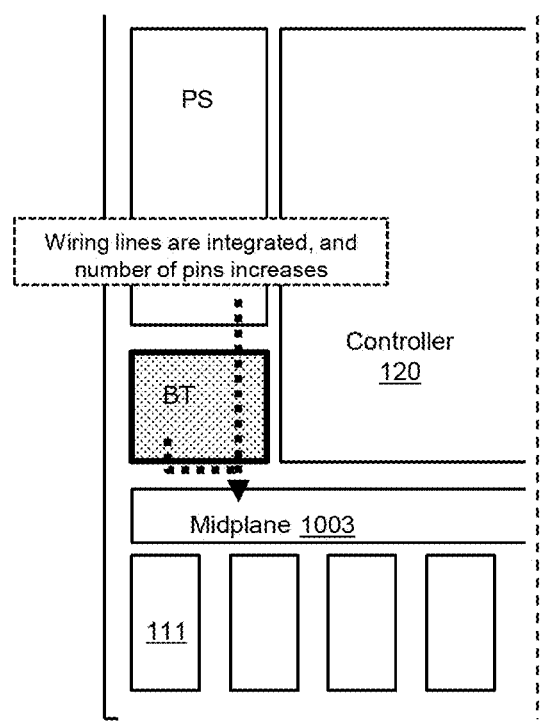
Figure 8C:
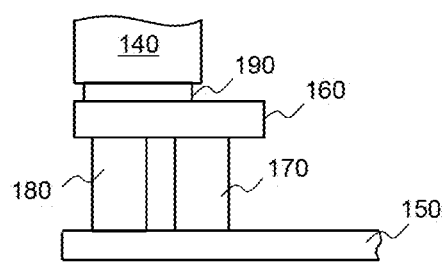

In the storage apparatus 100 according to the present embodiment, as shown in FIG. 8(C), the battery connector 190 in which the wiring lines between the power supply 130 and the battery 140 are integrated is coupled to the sub-midplane 160, the bus bar 170 in which a plurality of power lines of the power supply 130 are combined, are coupled between the sub-midplane 160 and the midplane 150, and electric wires other than the power lines of the power supply 130 are coupled by the connector 180. As a result, in the midplane 150, as shown in FIG. 8(D), the areas required for transmitting the power and signals from the power supply 130 and the battery 140 simply need to be the areas for coupling the two bus bars 170 and the connector 180, and therefore the vents 153 do not be closed.

Figure 8D:
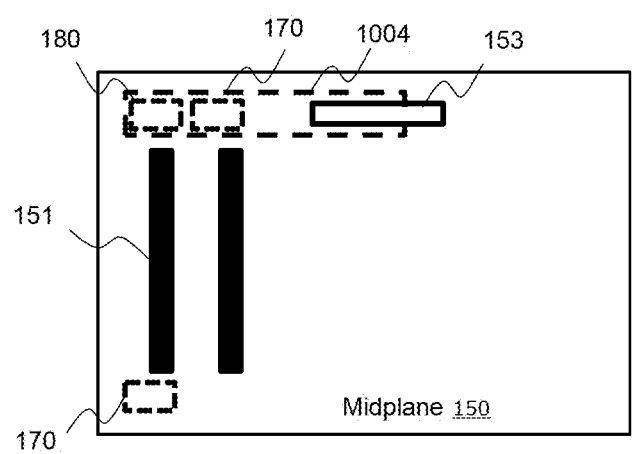

On the other hand, in a case where the connector in which the wiring lines of the power supply and the battery are integrated is coupled to the midplane 150 as assumed in FIG. 8(B), an area shown by a broken line 1004 in FIG. 8(D) needs to be reserved, and consequently the vents 153 for cooling the controller 120 are closed.

Pad-on-vias are described next.

Figure 9A:
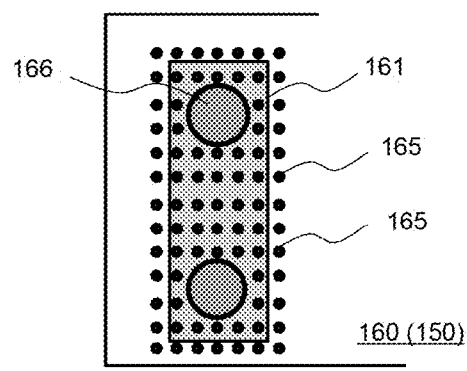
FIGS. 9(A), 9(B), and 9(C) are diagrams for explaining the effects of pad-on-vias according to the embodiment.
Figure 9B:
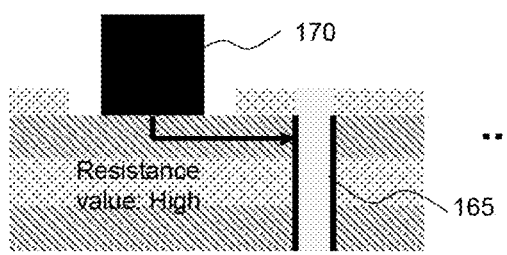
Figure 9C:
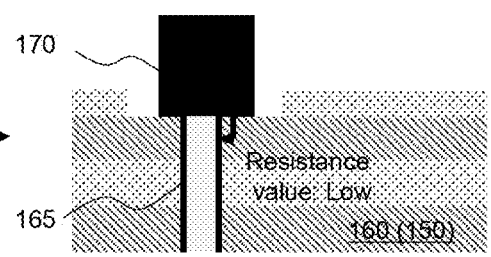

FIG. 9 is a diagram for explaining the effects of pad-on-vias according to the embodiment. FIG. 9(A) shows a coupling state of the bas bar in the storage apparatus 100 according to the embodiment, FIG. 9(B) shows a state in which the pad-on-vias are not adopted, and FIG. 9(C) shows a state in which the pad-on-vias are adopted. Note that FIG. 9(B) and FIG. 9(C) are each a schematic diagram particularly showing one of the plurality of vias 165.

Here, integrating the wiring lines by the bus bar as described above may increase the current and localize the heat generation. In order to disperse the heat to be generated, the pad-on-vias are adopted in the present embodiment.

In the storage apparatus 100, as shown in FIG. 9(A), the plurality of vias 165 are arranged in, for example, a grid-like pattern in and around the bus bar attachment area 161 to which the bus bar 170 of the sub-midplane 160 (midplane 150) is attached. Therefore, the bus bar 170 is attached to the sub-midplane 160 (midplane 150) in contact with the plurality of vias 165.

In a case where the bus bar 170 is coupled to an area away from the vias 165, as shown in FIG. 9(B), the distance the current from the bus bar 170 reaches the vias 165 becomes relatively long as shown in FIG. 9(B). In other words, the resistance value and the amount of heat generated become large.

On the other hand, by adopting the pad-on-vias, the bus bar 170 is coupled in contact with the vias 165, and the distance the current from the bus bar 170 reaches the vias 165 becomes short. That is, the resistance value and the amount of heat generated can be reduced. In addition, the heat generated in and around the bus bar 170 is transmitted to a wider area through the vias 165, thereby enhancing the cooling effect of the bus bar 170.

Figure 10:
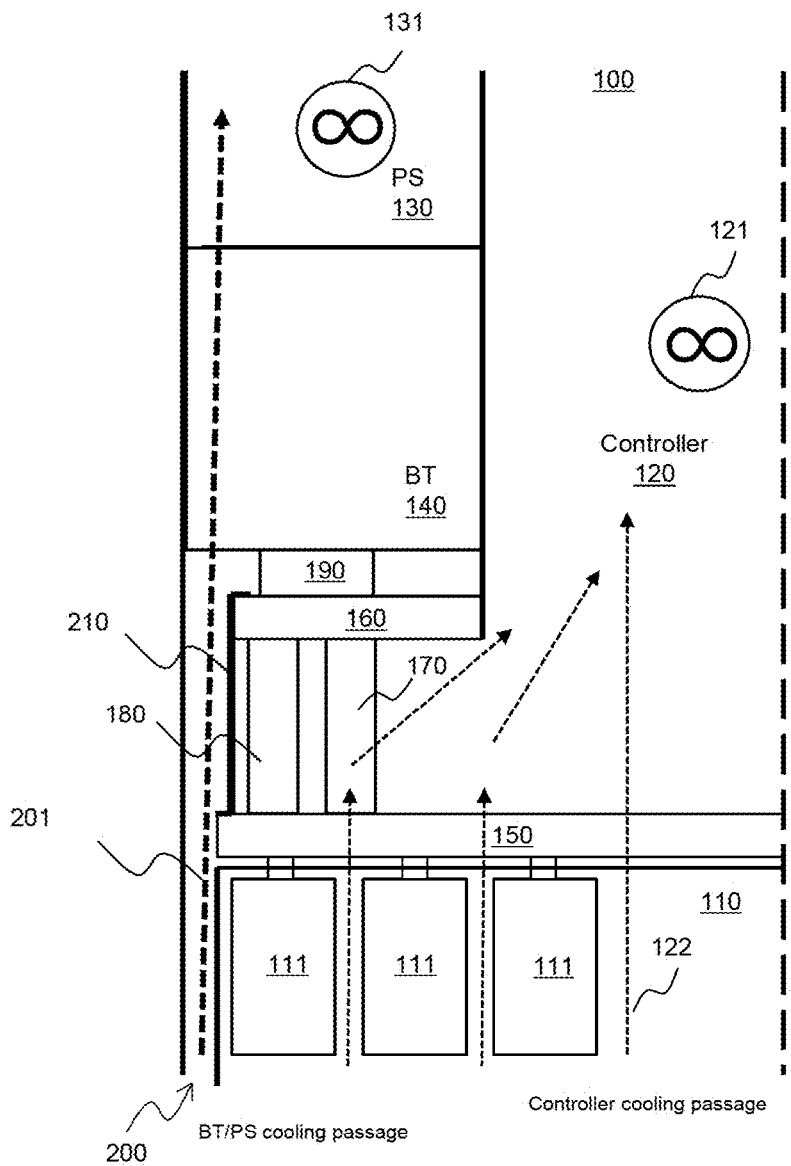
FIG. 10 is a diagram for explaining cooling of the battery according to the embodiment.

FIG. 10 is a diagram for explaining cooling of the battery according to the embodiment.

The controller cooling passage 122 extending from the front surface of the storage apparatus 100 to the controller 120 via the periphery of the drives 111 and the vents (153, 154) of the midplane 150, and the BT/PS cooling passage 201 that extends from the intake port 200 on the front surface of the storage apparatus 100 and passes through the side of the drive mounting unit 110 to reach the battery 140 and the power supply 130, are present in the storage apparatus 100. In the controller cooling passage 122, a fan 121 of the controller 120 discharges the air to the rear surface side, forming an air flow from the front surface of the storage apparatus 100 to the rear surface of the same. On the other hand, in the BT/PS cooling passage 201, the fan 131 of the power supply 130 discharges the air to the rear surface side, forming an air flow from the intake port 200 of the storage apparatus 100 to the rear surface of the power supply 130.

In the storage apparatus 100, a blocking unit 210 for blocking the space where the connector 180 and bus bar 170 are coupled and the BT/PS cooling passage 201, is provided between the midplane 150 and the sub-midplane 160. The blocking unit 210 may be, for example, a polyester adhesive tape (such as Mylar tape (Mylar is a registered trademark)).

With the blocking unit 210, the air that passes through the periphery of the drives 111, absorbs the heat of the drives 111 and passes through the midplane 150 can appropriately be prevented from being mixed with the air of the BT/PS cooling passage 201. Therefore, a rise in the temperature of the air flowing through the BT/PS cooling passage 201 can be suppressed, whereby the battery 140 can be cooled effectively and the life of the battery 140 can properly be maintained.

Note that the present invention is not limited to the foregoing embodiment and can appropriately be modified and implemented without departing from the spirit of the present invention. For example, in the foregoing embodiment, the bus bar 170 is coupled on the vias 165 in both the midplane 150 and the sub-midplane 160. However, the present invention is not limited to this configuration; for example, the bus bar 170 may be coupled on the via 165 in either the midplane 150 or the sub-midplane 160.

What is claimed is:

1. A storage apparatus mounted in a rack, the storage apparatus comprising:
    a power supply that supplies power;
    a battery that is placed on an apparatus front surface side of the power supply and supplies power during a backup operation;
    a drive mounting unit that is placed further toward the apparatus front surface side than the battery and that mounts a plurality of drives for storing data;
    a controller that controls an entirety of the apparatus;
    a midplane that is placed between the battery and the drive mounting unit and relays signals and power among the power supply, the battery, the drive mounting unit, and the controller; and
    a sub-midplane that is placed between the midplane and the battery and relays signals and power from the power supply and the battery to the midplane, wherein
    the midplane and the sub-midplane are coupled to each other by a bus bar for supplying the power from the power supply to the midplane, and by one or more electric wires for transmitting signals and/or power other than the power of the power supply from the power supply and the battery,
    the storage apparatus further comprises an air passage that is capable of supplying cooling air from an intake port, formed on the apparatus front surface, to the battery without allowing the cooling air to pass around a periphery of the drives.

2. The storage apparatus according to claim 1, wherein
    at least one of the sub-midplane and the midplane has, on an opposing surface thereof, a plurality of vias, and
    the bus bar is coupled to at least one of the sub-midplane and the midplane so as to contact with one or more of the plurality of vias.

3. The storage apparatus according to claim 1, further comprising a blocking unit that blocks mixing of air flowing through the air passage and air that has passed around a periphery of the drives and cooled the drives.

4. The storage apparatus according to claim 3, wherein the blocking unit closes a space between the sub-midplane and the midplane.

5. The storage apparatus according to claim 3, wherein the blocking unit blocks mixing of the air flowing through the air passage and air passing around a periphery of the bus bar.

6. The storage apparatus according to claim 1, wherein the drives are SSDs (Solid State Drive) coupled by NVMe (Non-Volatile Memory Express).

7. The storage apparatus according to claim 1, wherein the intake port is formed next to an end of the drive mounting unit at the apparatus front surface.

8. The storage apparatus according to claim 1, comprising two systems each including the power supply, the battery, the sub-midplane, and the controller.

9. The storage apparatus according to claim 8, wherein the power supply, the battery, and the sub-midplane are arranged on both sides of the controller.

10. The storage apparatus according to claim 1, wherein
   a plurality of electric wires for the signals and power from the power supply are coupled to the battery, and
   the battery is coupled to the sub-midplane by a common electric wire for a signal that can be sharing an electric wire with an signal of the power supply.

11. The storage apparatus according to claim 1, wherein
   the midplane and the sub-midplane are coupled to each other by a pair of the bus bars for supplying the power from the power supply to the midplane and by a connector that includes a plurality of electric wires for transmitting signals and/or power other than the power of the power supply from the power supply and the battery, and
   the connector is placed, at a position closer to outside of the storage apparatus than a high-voltage bus bar out of the bus bars that supplies a high voltage.

\* \* \* \* \*